United States Patent [19]
Narita

[11] Patent Number: 5,170,232
[45] Date of Patent: Dec. 8, 1992

[54] MOS FIELD-EFFECT TRANSISTOR WITH SIDEWALL SPACERS

[75] Inventor: Kaoru Narita, Tokyo, Japan
[73] Assignee: NEC Corporation, Tokyo, Japan
[21] Appl. No.: 709,818
[22] Filed: Jun. 4, 1991

Related U.S. Application Data

[63] Continuation of Ser. No. 571,456, Aug. 23, 1990, abandoned.

[30] Foreign Application Priority Data

Aug. 24, 1989 [JP] Japan .................................. 1-218960

[51] Int. Cl.$^5$ .................... H01L 29/10; H01L 21/265
[52] U.S. Cl. ...................................... 257/336; 437/41; 437/149; 257/338; 257/900
[58] Field of Search ................. 357/23.4, 42, 23.9; 437/41, 149

[56] References Cited

U.S. PATENT DOCUMENTS

| | | | |
|---|---|---|---|
| 4,697,333 | 10/1987 | Nakahara | 357/23.9 |
| 4,823,173 | 4/1989 | Beasom | 357/35 |
| 4,949,136 | 8/1990 | Jain | 357/23.9 |

FOREIGN PATENT DOCUMENTS

| | | |
|---|---|---|
| 187016 | 7/1986 | European Pat. Off. . |
| 198335 | 10/1986 | European Pat. Off. . |
| 308152 | 3/1989 | European Pat. Off. . |
| 60-177677 | 9/1985 | Japan . |

OTHER PUBLICATIONS

IEEE Transactions on Electron Devices, vol. ED-33, No. 11, Nov., 1986, New York US, pp. 1769-1779; Sergio Bampi et al.: "A Modified Lightly Doped Drain Structure for VLSI MOSFETs".
Patents Abstracts of Japan, vol. 10, No. 16 (E-375)(2073) Jan. 22, 1986 & JP-A-60 177677 (Suwa Deikosha K.K.) Sep. 11, 1985 (Computer obtained abstract).
Search Report for European Patent Application No. EP 90 11 6095, Feb. 7, 1991.
International Electron Devices Meeting 1985, Washington, D.C., Dec. 1-4, 1985, pp. 234-237, S. Bampi, et al., "Modified LDD Device Structures for VLSI".

*Primary Examiner*—Edward J. Wojciechowicz
*Attorney, Agent, or Firm*—Burns, Doane, Swecker & Mathis

[57] ABSTRACT

In a n-channel MOS transistor of LDD structure with sidewall spacers, a p-type diffusion layer is formed to be on the surface of a n$^-$ drain layer just underneath the sidewall spacer and to be separated from the channel region. The low impurity concentration drain layer therefore becomes separated from the sidewall spacer, and thus degradation incident to LDD due to injection of hot carriers into the sidewall spacer can be prevented.

5 Claims, 6 Drawing Sheets

MOS FIELD-EFFECT TRANSISTOR WITH SIDEWALL SPACERS

This application is a continuation of application Ser. No. 07/571,456, filed Aug. 23, 1990, now abandoned.

BACKGROUND OF THE INVENTION

This invention relates to a MOS field-effect transistor with sidewall spacers at the gate electrode sides, and more particularly to such a type of field effect transistor formed in a lightly doped drain (LDD) structure (referred to as an LDD transistor hereinafter).

A LDD transistor in the prior art comprises source/drain layers of a lower impurity concentration (referred to as LIC hereinafter) on the surface of a semiconductor substrate underneath the sidewall spacers of insulating material and source/drain layers of a higher impurity concentration (referred to as HIC hereinafter) at respective sides of LIC source/drain layers. The surfaces of the HIC source/drain layers are at respective outer sides of the sidewall spacers and connected to source/drain electrodes, respectively. The reason why the LIC drain layer is located underneath the sidewall spacer is to prevent the undesirable effect of hot carriers. Without LIC drain layers, then electric field concentration would occur in the vicinity of the drain just beneath the gate electrode, thereby generating hot carriers which in turn would be injected into the gate-insulating layer, leading to varying threshold voltage of the transistor. The formation of the LIC drain layer causes the peak electric field to relocate underneath the sidewall spacer, resulting in suppressing the injection of hot carriers into the gate-insulating layer and in turn preventing the threshold voltage of the LDD transistor voltage from varying.

In a LDD transistor where the peak field effect is found underneath the sidewall spacer, hot carriers are injected into the sidewall spacer This produces an undesirable phenomenon that degradation of the transistor noted as lowering the transconductance (gm) of the transistor with the lapse of time, occurs in the initial stage, not gradually but sharply. In an effort to prevent this, a slight increase in impurity concentration in the LIC drain layer can cause the peak electrid field to locate just underneath the gate electrode, but this results in inducing the above-mentioned varying threshold voltage.

The p-channel MOS transistor is less affected by hot carriers due to electric field concentration than is the n-channel MOS transistor. In conventional CMOS integrated circuits (referred to as ICs) therefore LDD structure was used only for the n-channel MOS transistor and not done for p-channel MOS transistors. Application of LDD structure to the p-channel MOS transistor as well, though advantageous from the viewpoint of improving the reliability, is difficult because the conventional CMOS ICs require additional photolithographic processing step for this.

SUMMARY OF THE INVENTION

It therefore is an object of the invention to provide a LDD transistor structure capable of working with the undesirable effect of hot carriers minimized.

Another object of the invention is to provide a CMOS semiconductor IC structure permitting also a p-channel MOS transistor component to be easily or simply formed in the form of a LDD transistor structure.

A further object of the invention is to provide a CMOS semiconductor IC composed of a p-channel MOS transistor formed in a LDD structure and a n-channel MOS transistor formed in a LDD structure, thereby allowing minimized injection of hot carriers into the sidewall spacers.

The feature of the LDD transistor according to the invention resides in that on the surface of the LIC layer, except the edge portion thereof contiguous to the channel region, there is provided a layer of the opposite conductivity type impurity. More specifically, an impurity region of the opposite conductivity type to the LIC drain layer is formed on the surface of the semiconductor substrate just underneath the sidewall spacer, to be enclosed by the LIC drain layer which is angle-shaped so that the impurity region is on the horizontal part of the LIC drain layer and is separated by the vertical part thereof from the channel region. Also a high impurity level (HIC) layer is formed on the outer side (when viewing the channel region as center) of the sidewall spacer to flank with the opposite conductivity-type impurity region and the LIC drain layer.

The feature of the structure according to the invention results in the following: such opposite conductivity-type impurity is formed between the sidewall spacer and the LIC layer so that the LIC layer becomes buried deep, which in turn cause the peak electric field to be relocated deep, from the surface of the semiconductor substrate. As a result, injection of hot carriers into the sidewall spacer is suppressed, thus preventing degradation incident to the LDD.

The electric field concentration tends to be one-sided towards the drain layer. From this viewpoint, for the source layer neither LIC layer nor opposite conductivity-type impurity region is needed. Unless these are formed in the source layer, however, instead extra photolithographic processing steps would be required. It is rather preferred to form these also in the source layer than to add photolithographic processing steps. The present invention, though it can be applied both to n-channel MOS transistor and to p-channel MOS transistor, it coule be more effective if applied to n-channel MOS transistor. However, there is an advantage that the formation of p-channel MOS transistors in a LDD structure can be achieved without needing additional photolithographic processing steps.

In an alternative embodiment of the invention, a CMOS semiconductor IC is provided which consists of a n-channel MOS transistor formed in a p-conductivity type part of a semiconductor substrate and a p-channel MOS transistor formed in a n-conductivity type part of a semiconductor substrate.

The n-channel MOS transistor comprises a n-type source/drain layer formed apart from each other on the surface in the p-type part of the semiconductor substrate; a pair of $n^{--}$-type source/drain layers formed on the surface in the p-type part of the semiconductor substrate and separated from each other by a channel region, each thereof at respective inner sides of the n-type source/drain layers and smaller in depth and lower in impurity concentration than the n-type source/drain layers; a pair of $p^{-}$-type regions each formed to be on the pair of $n^{--}$-type source/drain layers, respectively, and to be separated thereby from the channel region; a gate electrode formed above the channel region in the p-type part of the semiconductor substrate through the intermediation of a gate-insulating layer; a pair of sidewall spacers of insulating material each formed above the pair of $p^-$-type regions, respectively, and flanked with sides of the gate electrode, respectively.

The p-channel MOS transistor comprises a p-type source and drain layer formed apart from each other on the surface in a n-type part of the semiconductor substrate; a pair of $p^-$-type source/drain layers formed on the surface in the n-type part of the semiconductor substrate separated from each other by a channel region, each thereof at respective inner sides of the first p-type source/drain layers and being smaller in depth and lower in impurity concentration than the p-type source/drain layers; a gate electrode formed above the channel region in the n-type part of the semiconductor substrate through the intermediation of a gate-insulating layer; and a pair of sidewall spacers of insulating material each formed above the pair of p-type source/drain layers, respectively, and flanked by sides of the gate electrode, respectively.

A further alternative embodiment of the present invention provides a process of fabricating a n-channel MOS transistor suitable for use in CMOS ICs. This process comprises forming a gate electrode; introducing a first n-type impurity in self-alignment with the gate electrode into the surface in a p-type part of a semiconductor substrate; introducing a p-type impurity into the same surface as in the first n-type impurity introduction; forming a pair of sidewall spacers each at sides of the gate electrode, respectively; and introducing a second n-type impurity in self-alignment with the pair of sidewall spacers into a part of the same surface as in the first n-type impurity introduction.

BRIEF DESCRIPTION OF THE DRAWINGS

The above-mentioned and other objects, features and advantages of the invention will become more apparent by reference to the following detailed description of the preferred embodiments, taken in conjunction with the accompanying drawings in which.

DETAILED DESCRIPTION OF EMBODIMENTS

Figure 1A:
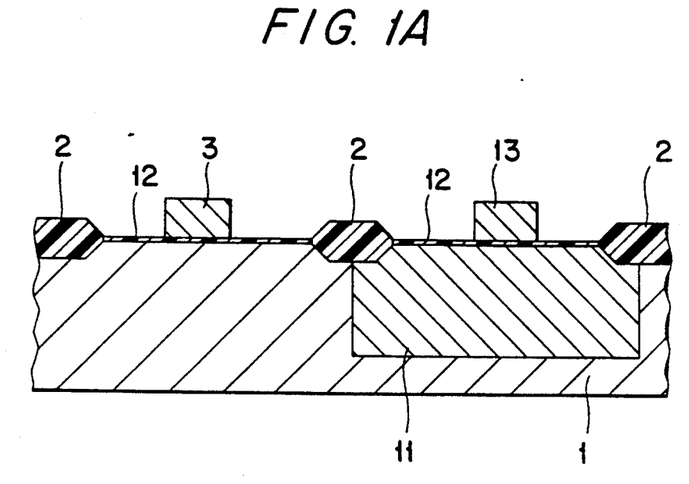
FIGS. 1A through 1G are longitudinal sectional views illustrative of the processing steps for fabricating a first embodiment of CMOS IC according to the present invention.
Figure 1B:
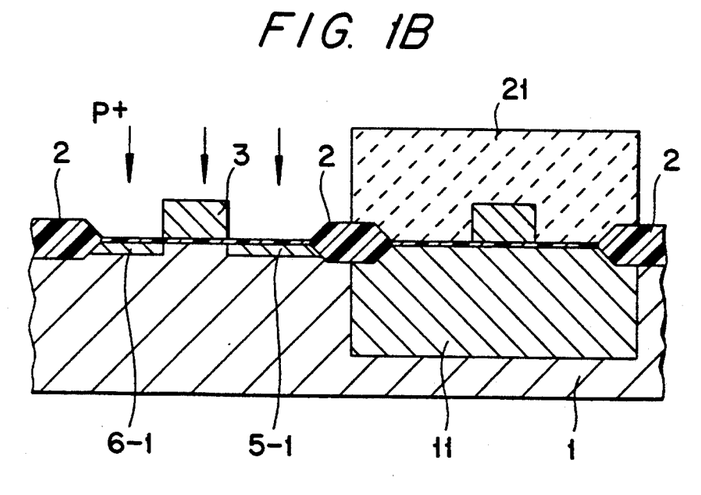
Figure 1C:
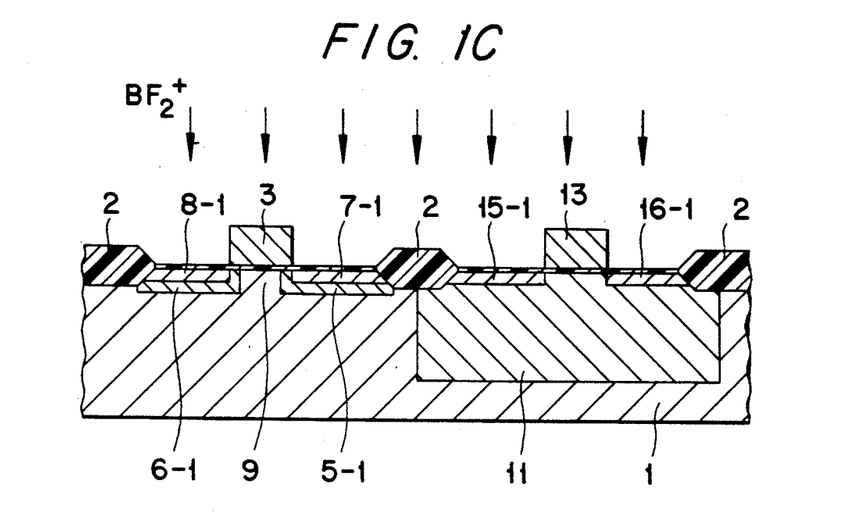
Figure 1D:
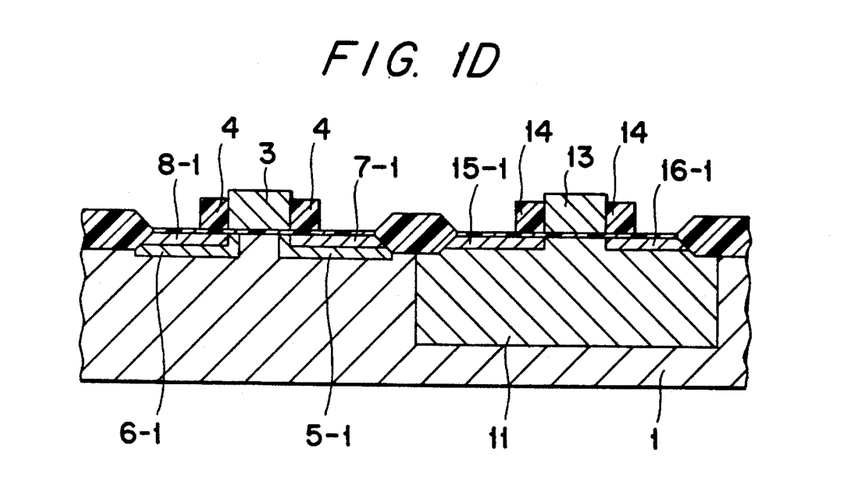
Figure 1E:
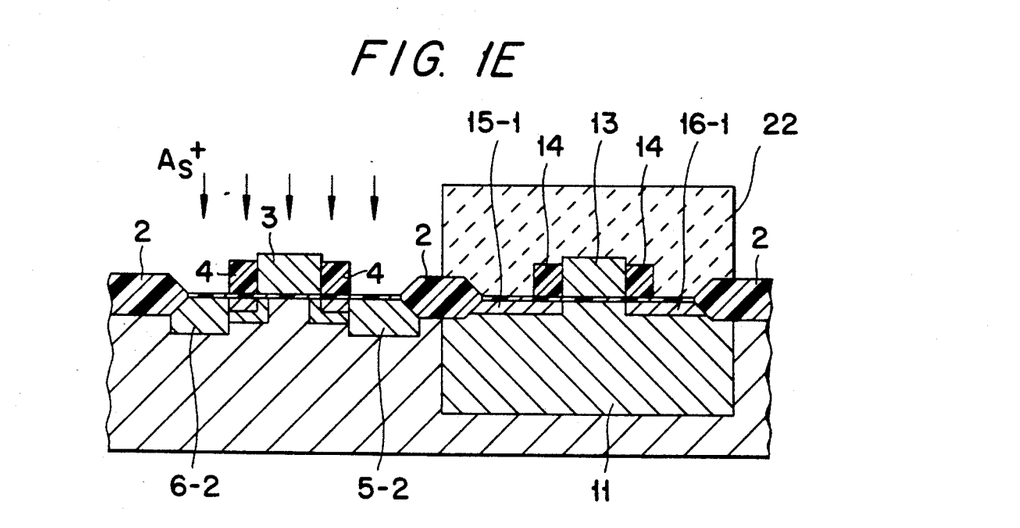
Figure 1F:
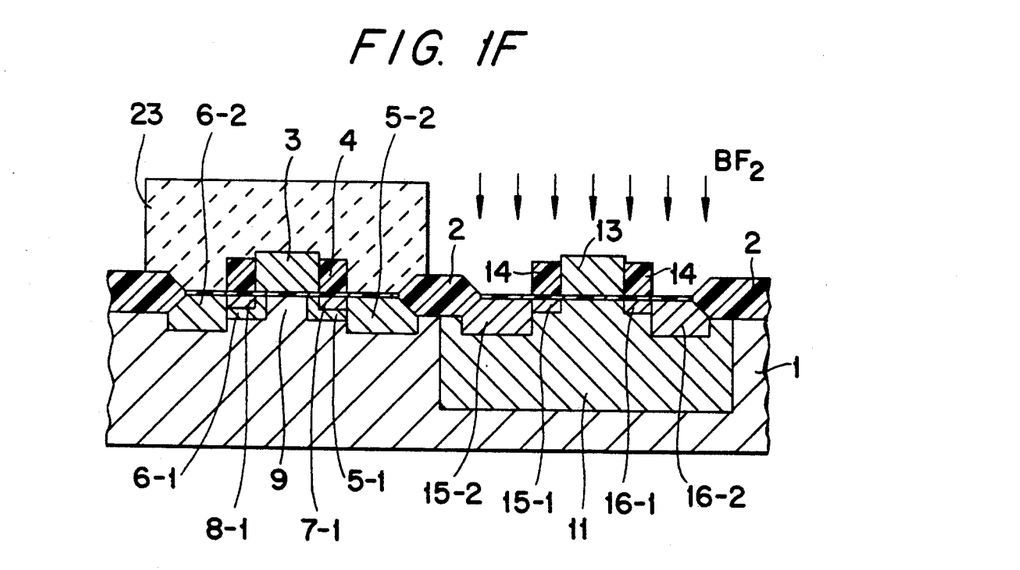
Figure 1G:
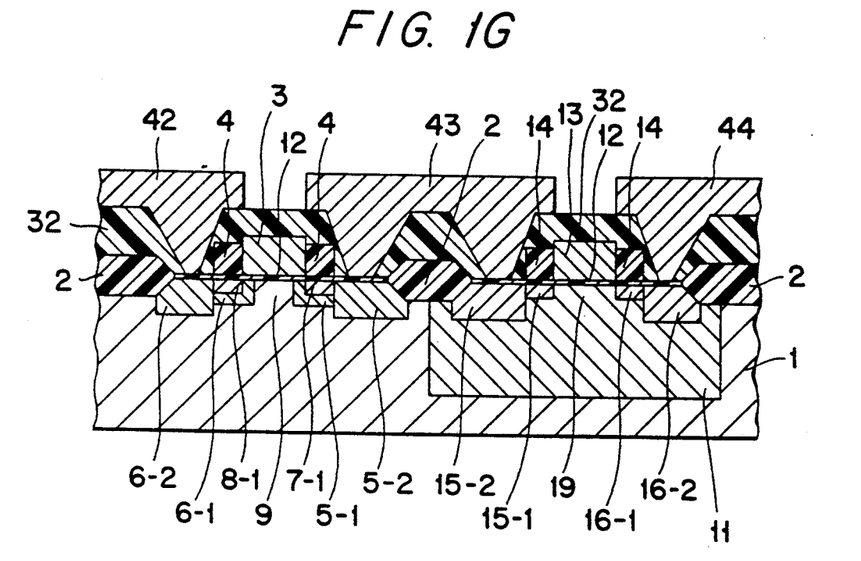
Figure 1H:
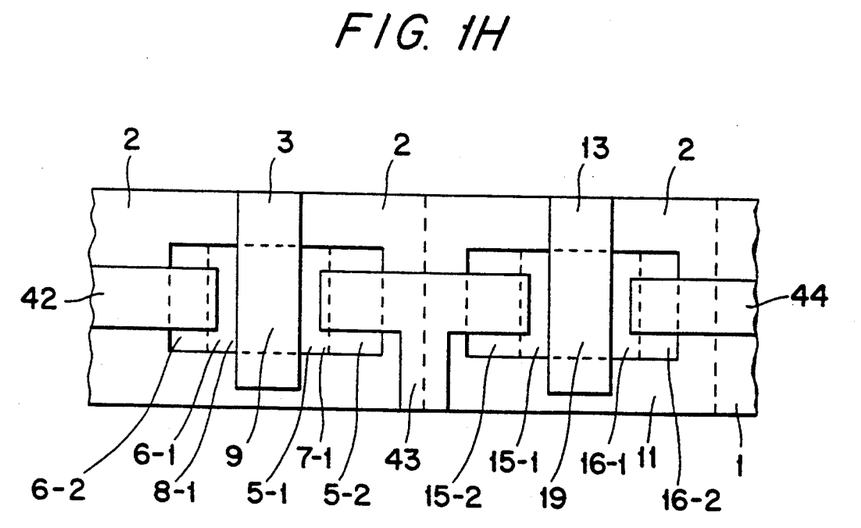
FIG. 1H is a plan view of the CMOS IC of FIG. 1G.

Referring to FIGS. 1G and 1H, the first embodiment of the CMOS IC according to the present invention comprises a n-channel MOS transistor (NMOST) formed on the surface of a p-type semiconductor substrate 1 which has a rectangular surface area (active area) surrounded by element-isolating insulating layers 2, and a p-channel MOS transistor (PMOST) formed on the surface area of a n-well 11 provided in the p-type semiconductor substrate 1 and having a rectangular surface area (active area) surrounded by element-isolating insulating zones 2. For simplification of the description, any element other than the above-mentioned is not shown and its explanation will be omitted.

In the active area of the NMOST, there is provided spaced apart a pair of HIC n-type drain/source layers 5-2, 6-2 each at opposite ends, respectively. There is additionally provided at respective inner sides of the pair of HIC drain/source layers a pair of angle-shaped n-type drain/source layers 5-1, 6-1 spaced apart from each other to define a channel region 9 between them. They are located at a small depth and are lower in impurity concentration compared with HIC n-type drain/source layers 5-2, 6-2. There is further provided a gate electrode 3 above the channel 9 through the intermediation of a gate insulating layer 12. A pair of p-type regions 7-1, 8-1 are found each defined by the insulating layer 12, the HIC drain/source layers 5-2, 6-2 and the LIC drain/source layers 5-1, 6-1, respectively. There is further provided sidewall spacers 4 of insulating material each at the opposite sides of the gate electrode, respectively, and above the p-type regions 7-1 and 8-1, respectively.

In the active area of PMOST or the n-well 11, there is provided a pair of HIC p-type drain/source layers 15-2, 16-2 each at opposite ends, respectively. There is additionally provided each at the respective inner sides of the pair of HIC drain/source layers 15-2, 16-2, a pair of p-type drain/source layers 15-1, 16-1 spaced apart from each other to define a channel region 19 between them. They are small in depth and low in impurity concentration compared with HIC n-type drain/source layers 15-2, 16-2. There is further provided a gate electrode 13 above the channel region 19 through the intermediation of a gate insulating layer 12. A pair of sidewall spacers 14 of insulating material are provided at the opposite sides of the gate electrode 13, respectively, and above p-type regions 15-1 and 16-1, respectively.

HIC source region 6-2 of NMOST is connected to a ground line 42. HIC source layer 16-2 of PMOST is connected to a power supply line 44. HIC drain layers 5-2 and 15-2 of both transistors are connected to a common output line 43. The gate electrodes 3 and 13 of both transistors are connected to a common input line. Thus both transistors constitute a CMOS inverter circuit.

Referring to FIGS. 1A through 1H, the process of fabricating the CMOS IC detailed as the first embodiment will be described in steps.

Referring to FIG. 1A, a n-well 11 is formed by a known technique in a p-type silicon substrate 1 containing boron at a concentration of $1 \times 10^{16}$ cm$^{-3}$. The n-well 11 contains phosphorus at a concentration of $1 \times 10^{17}$ cm$^{-3}$ and has a depth of 4 $\mu$cm. On the surface of the silicon substrate 1, element-isolating insulating layers 2 of silicon dioxide at 4,000 Å thick are formed to define active areas. On the surface of each active area, a gate insulating layer 12 of 200 Å thick is formed. At the center of each active area a non-doped polysilicon layer 3 or 13 is formed as a gate electrode of 3000 Å thick and 0.8 $\mu$cm in width which corresponds to the channel length. In the next step illustrated in FIG. 1B, after the active area of the part to be formed into PMOST is covered with a photoresist 21, phophorus ions (P+) are injected into the part of the active area to be formed into NMOST to form regions 5-1, 6-1 self-aligned with the gate electrode 3 and the element-isolating insulating layers 2 by the utilization of them as masks. The ion injection is carried out at a dose of approximately $1 \times 10^{13}$ cm$^{-2}$ and 50 to 60 KeV. The photoresist 21 is removed, and then heat-treatment for the activation of impurity is made at 900° C. for one hour. As the result, LIC (impurity concentration: $5 \times 10^{17}$ cm$^{-3}$ to $8 \times 10^{18}$ cm$^{-3}$) source/drain layers 6-1, 5-1 are formed on the active area self-aligned with the gate electrode. These layers are 0.2 μcm in depth. This ion injection is carried out at relatively high energy (50 to 60 KeV) to cause the peak concentration to be deep. In this case, it is found at 600 Å deep.

In the next step, the photoresist 21 is removed. As shown in FIG. 1C, $BF_2$ ions are injected into both NMOST and PMOST active areas at a low energy of 10 to 20 KeV at a dose of $10^{13}$ cm$^{-2}$ and heat-treated at 850° C. for 1 hour. Thereby in the NMOST part, p-type diffusion regions 7-1, 8-1 of 0.1 μcm thick and $1 \times 10^{18}$ cm$^{-3}$ in impurity concentration are formed on the surfaces of the LIC layers 5-1, 6-1, respectively, and simultaneously on the surface of the active area of the n-well 11, a pair of p-type diffusion layers 15-1, 16-1 as LIC PMOST drain/source layers are formed. This ion injection is carried out by the utilization of gate electrodes 3, 13 and element-isolating insulating layers 2 as masks. In the NMOST part, this ion injection is made with the same masks as those for forming the above-mentioned LIC drain/source layers, and hence additional photolithographic processing steps can be omitted. P-type diffusion regions 7-1, 8-1 are formed in self-alignment with the gate electrode 3 while LIC drain/source layers 5-1, 6-1 diffuse and spread so that the p-type diffusion layers 7-1, 8-1 each are enclosed by LIC drain/source layers 5-1, 6-1, respectively. Eventually they are separated by 0.07 μcm in width from the channel region 9 by LIC drain/source regions 5-1, 6-1. Likewise p-type LIC drain/source regions 15-1, 16-1 are formed in self-alignment with gate electrode 13. This step of ion injection is carried out at such a low energy that p-type diffusion layers 7-1, 8-1 is formed at a small depth from the surface.

In the following step, in each active area, a pair of sidewall spacers 4 or 14 each are formed on the opposite sides of gate electrode 3 or 13, respectively, as shown in FIG. 1D. This can be accomplished by depositing silicon dioxide film according to the CVD technique as a film of 2,000 to 3,000 Å thick, followed by anisotropic etching of the entire surface. They have each the same width of 2000 to 3000 Å. In the next step, after the PMOST part is covered with a photoresist 22, as shown in FIG. 1E, arsenic ions (As+) are injected into the NMOST part at 50 KeV. In this case, not only gate electrode 3 but also sidewall spacers 4 serve as masks. At ends of the active area, respectively, each of HIC n-type drain/source regions 5-2, 6-2 are formed in self-alignment with sidewall spacer 4 and element-isolating insulating layer 2. After heat-treatment, HIC drain/source regions 5-2, 6-2 each having a depth 0.3 μcm, and an impurity concentration of $1 \times 10^{20}$ cm$^{-3}$ result.

Then, as shown in FIG. 1F, the NMOST part is covered with a photoresist 23, $BF_2^+$ ions are injected at 50 KeV. Likewise gate electrode 13, sidewall spacers 14 and element-isolating insulating layers 2 serve as masks. At ends of the active area of the n-well 11, respectively, each of HIC p-type drain/source layers 15-2, 16-2 is formed in self-alignment with sidewall spacer 4 and element-isolating insulating layer 2. Thus HIC p-type drain/source layers 15-2, 16-2 each having a impurity concentration of about $1 \times 10^{20}$ cm$^{-3}$ and a depth of 0.4 μcm are obtained.

In the final step shown in FIG. 1G, the entire surface is covered with interlayer insulating film 32 in which then through-holes, for example, to the surfaces of HIC drain-source layers 5-2, 6-2, 15-2 and 16-2 are opened. Through the intermediation of contacts extending through the through-holes, the aluminium wiring comprising 42, 43 and 44 can be constructed.

In the NMOST of this embodiment, the sidewall spacer 4 is separated from n-type drain layers 5-1, 5-2 by p-type diffusion region 7-1, which effects to reduce injection of hot carriers into the sidewall spacer and thereby to prevent initial lowering of transconductance as observed in the prior art, contributing to improvement in the reliability of the transistor. The application of the present invention to the NMOST of LDD structure in a CMOS IC as in this embodiment permits also the PMOST to be formed in LDD structure only by the addition of the processing step of FIG. 1C, that is, without needing addition of photolithographic processing steps therefor.

Figure 2A:
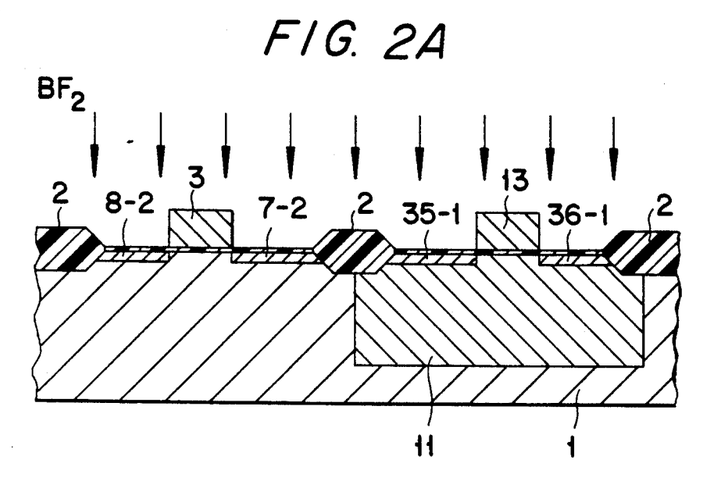
FIGS. 2A through 2C are longitudinal sectional views illustrative of the processing steps for fabricating a second embodiment of CMOS IC according to the present invention.
Figure 2B:
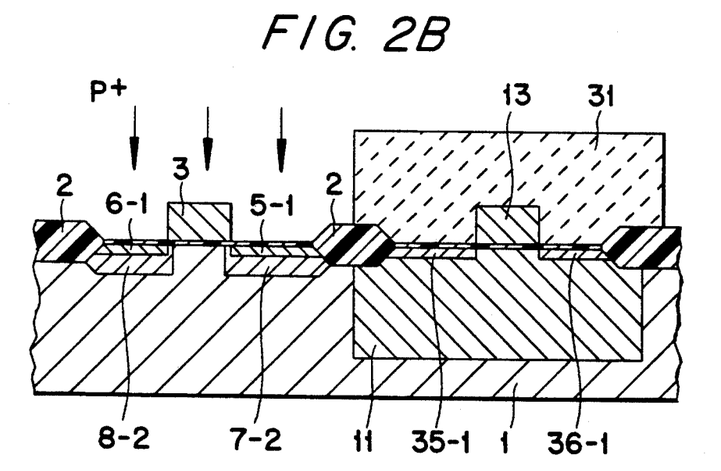
Figure 2C:
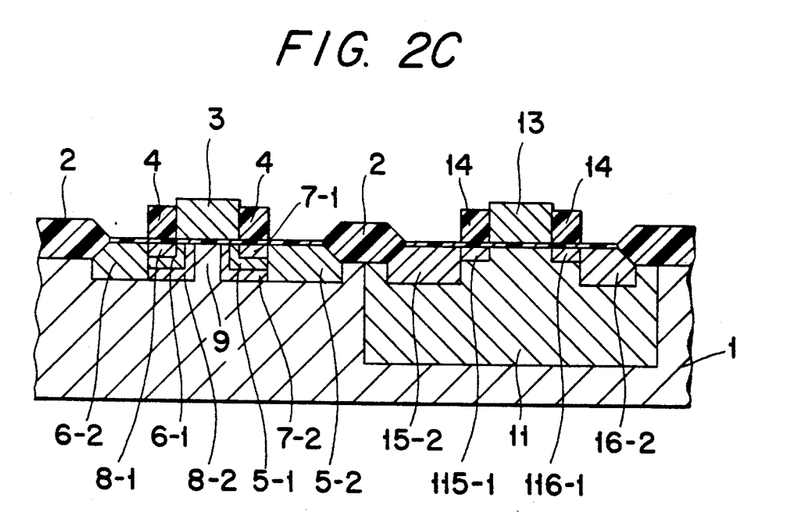

Referring to FIG. 2C, a CMOS IC of the second embodiment according to the present invention has a structure incorporating a pair of second p-type diffusion layers 7-2, 8-2 in addition to the structure of the first embodiment. The pair of second p-type diffusion layers 7-2, 8-2 are formed in angle-shape to define a channel region 9 between them and to surround LIC n-type drain/source layers 5-1, 6-1, respectively, in conjunction with HIC n-type layers 5-2, 6-2. They are 0.3 μcm thick and approximately $1 \times 10^{17}$ cm$^{-3}$ in impurity concentration.

Referring to FIGS. 2A through 2C, the process of fabricating the second embodiment of the present invention is described. After the structure of FIG. 1A is made, $BF_2^+$ ions are injected into the entire surface at a relatively high energy of about 1000 KeV energy, as shown in FIG. 2A to form a pair of p-type diffusion layers 7-2, 8-2 in the active area of the NMOST part and another pair of p-type diffusion layers 35-1, 36-1 in the active area of the PMOST (n-well) part, respectively. The subsequent steps proceed as in the first embodiment. As illustrated in FIG. 2B, the PMOST part is covered with a photoresist 31, and then injection of phosphorus ions is carried out into the NMOST part so that n-type LIC drain/source layers 5-1, 6-1 are formed to be enclosed by the p-type diffusion layers 7-2, 8-2. Subsequently in the same way as the first embodiment, $BF_2^+$ ions are injected into the entire surface to form sidewall spacers 4, 14. Then high level drain/source layers 5-2, 6-2, 15-2, 16-2 are formed, and thus the structure illustrated in FIG. 2C is obtained. Moreover the p-type LIC drain/source layers 115-1, 116-1 in the PMOST part are higher in impurity concentration in virtue of the injection of $BF_2^+$s ions as illustrated in FIG. 2A than p-type LIC drain/source layers 15-1, 16-1 in FIG. 1G.

In the second embodiment, each of n-type LIC drain/source layers 5-1, 6-1 is enclosed by p-type diffusion layers 7-2, 8-2, respectively, which are higher in impurity concentration than p-type semiconductor substrate 1, leading to improvement in punch-through voltage between the source and drain. The punch-through voltage is noted as an increased value of at least 12V compared with the structure of FIG. 1G noted to be at least 8V, and this can contribute to shorter width between the source and drain, and in turn to a finer transistor structure.

What is claimed is:

1. A MOS transistor comprising:
    a first source layer and a first drain layer formed into the surface of a one conductivity type part of a semiconductor substrate in opposing, spaced relation to each other, said first source layer and said first drain layer having the opposite conductivity type to that of said one conductivity type part of said semiconductor substrate;

a second source layer and a second drain layer of said opposite conductivity type formed into the surface of said one conductivity type part of said semiconductor substrate in spaced, opposing relation to each other with an outer side surface of said second source layer being adjacent to a lower portion of the inner side surface of said first source layer and with an outer side surface of said second drain layer being adjacent to a lower portion of the inner side surface of said first drain layer, said second source layer and said second drain layer being smaller in depth and lower in impurity concentration than said first source layer and said first drain layer;

a pair of regions of said one conductivity type formed in opposing, spaced relation to each other, one region of said pair of regions of said one conductivity type having an outer side surface adjacent to an upper portion of said inner side surface of said first source layer and having an inner side surface and a bottom surface surrounded by said second source layer, the other region of said pair of regions of said one conductivity type having an outer side surface adjacent to an upper portion of said inner side surface of said first drain layer and having an inner side surface and a bottom surface surrounded by said second drain layer;

a gate electrode formed on a gate insulating layer above a remaining portion of said one conductivity type part of said semiconductor substrate between said inner side surface of said first source layer and said inner side surface of said first drain layer; and a pair of sidewall spacers of insulating material, one of said pair of sidewall spacers being formed in self-aligned, overlying relation above said one region of said pair of regions of said one conductivity type, and the other of said pair of sidewall spacers being formed in self-aligned, overlying relation above said other region of said pair of regions of said one conductivity type, and each of said pair of sidewall spacers being adjacent to a respective opposing side of said gate electrode.

2. A MOS transistor as set forth in claim 1, further comprising:

a second pair of regions of said one conductivity type formed in opposing, spaced relation to each other, one region of said second pair of regions of said one conductivity type having an outer side surface adjacent to a portion of said inner side surface of said first source layer located below said lower portion of said inner side surface of said first source layer, and said one region of said second pair of regions of said one conductivity type surrounding a bottom surface and an inner side surface of said second source layer, the other region of said second pair of regions of said one conductivity type having an outer side surface adjacent to a portion of said inner side surface of said first drain layer located below said lower portion of said inner side surface of said first drain layer and said other region of said second pair of regions of said one conductivity type surrounding a bottom surface and an inner side surface of said second drain layer.

3. A CMOS integrated circuit comprising:

a first n-type source layer and a first n-type drain layer formed into the surface in a p-type part of a semiconductor substrate in spaced, opposing relation to each other;

a second n-type source layer and a second n-type drain layer formed into the surface of said p-type part of said semiconductor substrate in opposing, spaced relation to each other with an outer side surface of said second n-type source layer being adjacent to a lower portion of the inner side surface of said first n-type source layer and with an outer side surface of said second n-type drain layer being adjacent to a lower portion of the inner side surface of said first n-type drain layer, said second n-type source layer and said second n-type drain layer being smaller in depth and lower in impurity concentration than said first n-type source layer and said first n-type drain layer;

a pair of p-type regions formed in opposing, spaced relation to each other, one region of said pair of p-type regions having an outer side surface adjacent to an upper portion of said inner side surface of said first n-type source layer and having an inner side surface and a bottom surface surrounded by said second n-type source layer, the other region of said pair of p-type regions having an outer side surface adjacent to an upper portion of said inner side surface of said first n-type drain layer and having an inner side surface and a bottom surface surrounded by said second n-type drain layer;

a first gate electrode formed on a gate insulating layer above a remaining portion of said p-type part of said semiconductor substrate between said inner side surface of said first n-type source layer and said inner side surface of said first n-type drain layer;

a pair of first sidewall spacers of insulating material, one of said pair of first sidewall spacers being formed in self-aligned, overlying relation above said one region of said pair of p-type regions, and the other of said pair of first sidewall spacers being formed in self-aligned, overlying relation above said other region of said pair of p-type regions, and each of said pair of first sidewall spacers being adjacent to a respective, opposing side of said first gate electrode;

a first p-type source layer and a first p-type drain layer formed into the surface in a n-type part of said semiconductor substrate in spaced, opposing relation to each other;

a second p-type source layer and a second p-type drain layer formed into the surface of said n-type part of said semiconductor substrate in opposed, spaced relation to each other with an outer side surface of said second -p-type source layer being adjacent to an upper portion of the inner side surface of said first p-type source layer and with an an outer side surface of said second p-type drain layer being adjacent to an upper portion of the inner side surface of said first p-type drain layer, said second p-type source layer and said second p-type drain layer being smaller in depth and lower in impurity concentration than said first p-type source layer and said first p-type drain layer;

a second gate electrode formed on a gate insulating layer above a remaining portion of said n-type part of said semiconductor substrate between said inner side surface of said first p-type source layer and said inner side surface of said first p-type drain layer; and a pair of second sidewall spacers of insulating material, one of said pair of second sidewall spacers being formed in self-aligned, overlying relation above said second p-type source layer and the other of said pair of second sidewall spacers being formed in self-aligned, overlying relation above said second p-type drain layer, and each of said pair of second sidewall spacers being adjacent to a respective, opposing side of said second gate electrode.

4. The CMOS integrated circuit as set forth in claim 3, further comprising:

a second pair of p-type regions in opposing, spaced relation to each other, one region of said second pair of p-type regions having an outer side surface adjacent to a portion of said inner side surface of said first n-type source layer located below said lower portion of said inner side surface of said first n-type source layer and said one region of said second pair of p-type regions surrounding a bottom surface and an inner side surface of said second n-type source layer, the other region of said second pair of p-type regions having an outer side surface adjacent to a portion of said inner side surface of said first n-type drain layer located below said lower portion of said inner side surface of said first n-type drain layer and said other region of said second pair of p-type regions surrounding a bottom surface and an inner side surface of said second n-type drain layer.

5. A process of fabricating a n-channel MOS transistor comprising the steps of:

forming a gate-insulating layer on the surface in a p-type part of a semiconductor substrate;

forming a gate electrode on said gate-insulating layer;

introducing a first n-type impurity in self-alignment with said gate electrode into the surface in said p-type part of said semiconductor substrate;

introducing a p-type impurity in self-alignment with said gate electrode into the same surface as in said first n-type impurity introduction;

forming a pair of sidewall spacers each at an opposing side of said gate electrode, respectively; and additionally introducing a second n-type impurity in self-alignment with said pair of sidewall spacers into partially the same surface as said first n-type impurity introduction.

* * * * *